(12) United States Patent
Yamada et al.

(10) Patent No.: US 11,799,047 B2
(45) Date of Patent: Oct. 24, 2023

(54) AVALANCHE PHOTODIODE AND METHOD FOR MANUFACTURING SAME

(71) Applicant: Nippon Telegraph and Telephone Corporation, Tokyo (JP)

(72) Inventors: Yuki Yamada, Tokyo (JP); Fumito Nakajima, Tokyo (JP); Hideaki Matsuzaki, Tokyo (JP); Masahiro Nada, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 204 days.

(21) Appl. No.: 17/440,555

(22) PCT Filed: Mar. 13, 2020

(86) PCT No.: PCT/JP2020/011107
§ 371 (c)(1),
(2) Date: Sep. 17, 2021

(87) PCT Pub. No.: WO2020/195954
PCT Pub. Date: Oct. 1, 2020

(65) Prior Publication Data
US 2022/0123163 A1    Apr. 21, 2022

(30) Foreign Application Priority Data

Mar. 28, 2019 (JP) ................. 2019-062850

(51) Int. Cl.
*H01L 31/107* (2006.01)
*H01L 31/0304* (2006.01)
*H01L 31/18* (2006.01)

(52) U.S. Cl.
CPC .... *H01L 31/1075* (2013.01); *H01L 31/03046* (2013.01); *H01L 31/1844* (2013.01); *H01L 31/1852* (2013.01); *H01L 31/1892* (2013.01)

(58) Field of Classification Search
None
See application file for complete search history.

(56) References Cited

U.S. PATENT DOCUMENTS 6,894,267 B2* 5/2005 Kakinuma ............ H01L 31/105
257/225
2004/0056179 A1* 3/2004 Wang .................. H01L 27/1443
257/E27.128

(Continued)

FOREIGN PATENT DOCUMENTS

WO    WO-2018008960 A1 * 1/2018 ....... H01L 31/02005

OTHER PUBLICATIONS

Chang, S. et al., "Investigation of Au/Ti/Al ohmic contact to N-type 4H-SiC," Elsevier, Solid-State Electronics, vol. 49, Oct. 17, 2005, 5 pages.
Hirota, Y. et al., "Reliable non-Zn-diffused InP/InGaAs avalanche photodiode with buried n-InP layer operated by electron injection mode," Electronics Letters, vol. 40, No. 21, Oct. 14, 2004, 2 pages.
Katz, A. et al., "Pt/Ti/n-InP nonalloyed ohmic contacts formed by rapid thermal processing," Journal of Applied Physics, vol. 67, No. 8, Aug. 17, 1998, 5 pages.

(Continued)

*Primary Examiner* — Evren Seven
(74) *Attorney, Agent, or Firm* — Slater Matsil, LLP

(57) ABSTRACT

A substrate, a first n-type contact layer, a buffer layer, a multiplication layer, an electric field control layer, an absorption layer, and a p-type contact layer are provided. An electrically conductive layer is formed in a central portion of the buffer layer. The substrate is made of a semiconductor having thermal conductivity higher than that of InP, such as SiC, and the first n-type contact layer is made of the same semiconductor as that of the substrate but having n-type conductivity. An n electrode is formed over the first n-type contact layer via a second n-type contact layer.

10 Claims, 4 Drawing Sheets

(56) References Cited

U.S. PATENT DOCUMENTS

| | | | | |
|---|---|---|---|---|
| 2004/0245592 | A1* | 12/2004 | Harmon | G01J 1/4228 |
| | | | | 257/E27.128 |
| 2005/0051861 | A1* | 3/2005 | Shi | H01L 31/107 |
| | | | | 257/438 |
| 2006/0249747 | A1* | 11/2006 | Shushakov | H03F 3/70 |
| | | | | 257/E27.128 |
| 2009/0121305 | A1* | 5/2009 | Pan | H01L 31/18 |
| | | | | 438/69 |
| 2010/0009492 | A1* | 1/2010 | Vu | H01L 21/02488 |
| | | | | 438/93 |
| 2013/0043372 | A1* | 2/2013 | Wehner | H01L 27/14652 |
| | | | | 250/208.1 |
| 2020/0052147 | A1* | 2/2020 | Mazzillo | H01L 31/12 |

OTHER PUBLICATIONS

Liu, H. et al., "4H-SiC PIN Recessed-Window Avalanche Photodiode With High Quantum Efficiency," IEEE Photonics Technology Letters, vol. 20, No. 18, Sep. 15, 2008, 3 pages.

Masana, F.N., "Thermal characterisation of power modules," Pergamon, Microelectronics Reliability, vol. 20, Jul. 29, 1999, 7 pages.

Schwarz, S. et al., "InGaAs/InP superlattice mixing induced by Zn or Si diffusion," Applied Physics Letters, vol. 53, No. 12, Jun. 4, 1998, 4 pages.

Takagi, H. et al., "Surface activated bonding of silicon wafers at room temperature," Applied Physics Letters, vol. 68, No. 16, Feb. 2, 1996, 4 pages.

\* cited by examiner

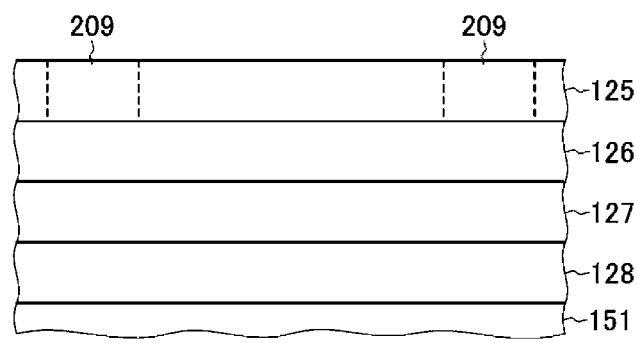
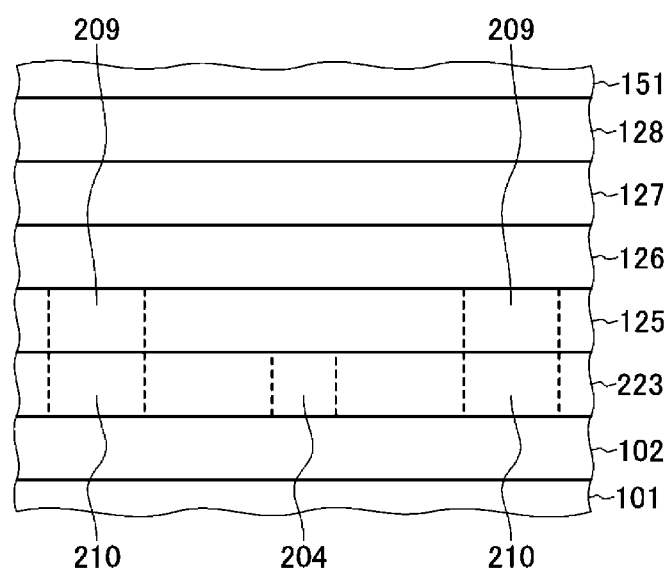

AVALANCHE PHOTODIODE AND METHOD FOR MANUFACTURING SAME

This patent application is a national phase filing under section 371 of PCT/JP2020/011107, filed Mar. 13, 2020, which claims the priority of Japanese patent application no. 2019-062850, filed Mar. 28, 2019, each of which is incorporated herein by reference in its entirety.

TECHNICAL FIELD

The present invention relates to an avalanche photodiode and a method for manufacturing the same.

BACKGROUND

A light reception element is an element responsible for the role of conversion of an optical signal propagating along an optical fiber into an electric signal in optical communication. An increase in the communication capacity, for example, in a data center in recent years requires an increase in transmission capacity of an optical fiber communication system, and a light reception element used in the optical fiber communication system is required to operate at high speed. Examples of a high-speed semiconductor light reception element primarily include a PIN photodiode (PIN-PD) and an avalanche photodiode (APD). Among the examples, an avalanche photodiode itself has a signal amplification function and is widely used as a light reception element more sensitive than a PIN photodiode.

In an avalanche photodiode for optical communication, there has been a proposed element in which an n-type contact layer, a multiplication layer, an electric field control layer, an absorption layer, and a p-type contact layer are sequentially layered on an InP substrate (Non-Patent Literature 1). In the element described above, the absorption layer is made of InGaAs, which has a large optical absorption coefficient in a communication wavelength band (1.55 μm or 1.3 μm). Further, in the element described above, the multiplication layer, where a high electric field is produced, is made of InP, which has a bandgap wider than that of InGaAs. Moreover, the element described above uses a p-doped electric field control layer to produce a higher-intensity electric field in the multiplication layer than in the absorption layer.

When voltage is applied to the element, the intensity of the electric field in the multiplication layer and the electric field control layer first increases, resulting in depletion in the electric field control layer and then an increase in the intensity of the electric field in the absorption layer. The controllability of the doping profile in the electric field control layer is an important factor in the design of the operating voltage of an avalanche photodiode because the controllability affects, for example, the on-voltage at which the electric field control layer starts producing optical current, the breakdown voltage, and the amplification factor at each applied voltage.

The operating voltage of an avalanche photodiode is higher than that of a PIN photodiode, and leakage current is therefore likely to be produced during the operation of the avalanche photodiode. The produced leakage current leads to a decrease in the reliability of the avalanche photodiode and deterioration of the SN ratio thereof. In particular, the electric field produced at the element side surface of the avalanche photodiode leads to surface leakage current. An avalanche photodiode is therefore so designed in accordance with the application thereof that the electric field at the side surface is suppressed.

As a technology for suppressing the aforementioned electric field produced at the element side surface of an avalanche photodiode, there is a proposed technology for confining the electric field within the element by forming an electrically conductive layer in a central portion of the element in plan view, for example, by using an ion injection technology (see Non-Patent Literature 1). According to the technology, the intensity of the electric fields in the multiplication layer and the absorption layer, which are exposed via the element side surface, can be suppressed to values smaller than that in the central portion of the element, whereby the surface leakage current at the element side surface can be suppressed.

The response speed of an avalanche photodiode is determined by the element capacity, the element resistance, and the period required for the carrier to travel from the absorption layer to each contact layer. It is therefore conceivable as a method for achieving a high-speed avalanche photodiode to reduce the element diameter in plan view to reduce the element capacity.

CITATION LIST

Non-Patent Literature

Non-Patent Literature 1: Y. Hirota et al., "Reliable non-Zn-diffused InP/InGaAs avalanche photodiode with buried n-InP layer operated by electron injection mode", Electronics Letters, vol. 40, no. 21, 2004.

Non-Patent Literature 2: H. Liu et al., "4H—SiC PIN Recessed-Window Avalanche Photodiode With High Quantum Efficiency", IEEE Photonics Technology Letters, vol. 20, no. 18, pp. 1551-1553, 2008.

Non-Patent Literature 3: F. N. Masana, "Thermal characterisation of power modules", Microelectronics Reliability, vol. 40, pp. 155-161, 2000.

Non-Patent Literature 4: S. C. Chang et al., "Investigation of Au/Ti/Al ohmic contact to N-type 4H—SiC", Solid-State Electronics, vol. 49, pp. 1937-1941, 2005.

Non-Patent Literature 5: S. A. Schwarz et al., "InGaAs/InP superlattice mixing induced by Zn or Si diffusion", Applied Physics Letters, vol. 53, no. 12, pp. 1051-1053, 1988.

Non-Patent Literature 6: A. Katz et al., "Pt/Ti/n-InP nonalloyed ohmic contacts formed by rapid thermal processing", Journal of Applied Physics, vol. 67, no. 8, pp. 3872-3875, 1980.

Non-Patent Literature 7: H. Takagi et al., "Surface activated bonding of silicon wafers at room temperature", Applied Physics Letters, vol. 68, no. 16, pp. 2222-2224, 1996.

SUMMARY

Technical Problem

As described above, reducing the element diameter for higher speed leads to an increase in the current density during the operation of an avalanche photodiode, resulting in an increase in the amount of heat generated in the multiplication layer. An avalanche photodiode for a non-communication application can be made of a semiconductor material having high thermal conductivity, such as SiC, as described in Non-Patent Literature 2, whereas an avalanche photodiode for optical communication is made of InGaAs, InP, or any other material formed on an InP substrate, as described in Non-Patent Literature 1. Since the generated heat is dissipated out of the element primarily via the substrate, the heat generated in the multiplication layer when light is inputted is unlikely to be transferred to the space outside the element in an optical communication application, as compared with a non-communication application using a substrate made of a material having high thermal conductivity, such as SiC, and there is therefore room for improvement in durability against the optical input (optical input resistance), such as failure of the element due to an increase in the element temperature.

To achieve the improvement, it is conceivable to produce an avalanche photodiode by crystally growing each layer made of InGaAs, InP, or any other material on a substrate that excels in heat dissipation, such as SiC. A highly heat dissipative substrate made, for example, of SiC, however, does not lattice-match with a III-V compound semiconductor, which has a bandgap suitable for a wavelength band used in optical communication, such as InGaAs, resulting in a problem of extreme difficulty in element production. The related art therefore has a problem of a difficulty in increasing the heat dissipation capability of an avalanche photodiode made of a III-V compound semiconductor.

Embodiments of the present invention can solve the problems described above, and an embodiment of the present invention increases the heat dissipation capability of an avalanche photodiode made of a III-V compound semiconductor.

Means for Solving the Problem

An avalanche photodiode according to embodiments of the present invention includes a substrate made of a semiconductor having thermal conductivity higher than thermal conductivity of InP, a first n-type contact layer formed on the substrate and made of the semiconductor having n-type conductivity, a multiplication layer formed on the first n-type contact layer and made of a non-doped III-V compound semiconductor having a plane-direction lattice constant that matches with a plane-direction lattice constant of InP, an electric field control layer formed on the multiplication layer and made of a III-V compound semiconductor having a plane-direction lattice constant that matches with the plane-direction lattice constant of InP, an absorption layer formed on the electric field control layer and made of a III-V compound semiconductor having a plane-direction lattice constant that matches with the plane-direction lattice constant of InP, a p-type contact layer formed on the absorption layer and made of a p-type III-V compound semiconductor having a plane-direction lattice constant that matches with the plane-direction lattice constant of InP, a buffer layer formed between the first n-type contact layer and the multiplication layer and made of a non-doped III-V compound semiconductor having a plane-direction lattice constant that matches with the plane-direction lattice constant of InP, an n-type electrically conductive layer formed in a central portion of the buffer layer in plan view, a second n-type contact layer formed on the first n-type contact layer around the multiplication layer and made of an n-type III-V compound semiconductor having a plane-direction lattice constant that matches with the plane-direction lattice constant of InP, a p electrode formed on the p-type contact layer, and an n electrode formed on the second n-type contact layer.

In a configuration example of the avalanche photodiode described above, the buffer layer is made of a non-doped III-V compound semiconductor having a plane-direction lattice constant that matches with the plane-direction lattice constant of InP.

In a configuration example of the avalanche photodiode described above, the first n-type contact layer and a layer formed on the first n-type contact layer and made of a III-V compound semiconductor are so formed as to be bonded to each other.

In a configuration example of the avalanche photodiode described above, the buffer layer is made of the semiconductor to which no dopant has been doped, and the avalanche photodiode further includes a third n-type contact layer formed between the first n-type contact layer and the second n-type contact layer and made of the semiconductor having n-type conductivity.

In a configuration example of the avalanche photodiode described above, the buffer layer, the n-type electrically conductive layer, and the first n-type contact layer are so formed that the buffer layer and the n-type electrically conductive layer are bonded to the first n-type contact layer.

A method for manufacturing an avalanche photodiode according to embodiments of the present invention includes a first step of forming a first n-type contact layer on a substrate made of a semiconductor having thermal conductivity higher than thermal conductivity of InP, the first n-type contact layer made of the semiconductor having n-type conductivity; a second step of forming layers below in a presented order on another substrate made of a III-V compound semiconductor having a plane-direction lattice constant that matches with a plane-direction lattice constant of InP, the layers including a p-type contact layer made of a p-type III-V compound semiconductor having a plane-direction lattice constant that matches with the plane-direction lattice constant of InP, an absorption layer made of a III-V compound semiconductor having a plane-direction lattice constant that matches with the plane-direction lattice constant of InP, an electric field control layer made of a III-V compound semiconductor having a plane-direction lattice constant that matches with the plane-direction lattice constant of InP, and a multiplication layer made of a non-doped III-V compound semiconductor having a plane-direction lattice constant that matches with the plane-direction lattice constant of InP; a third step of causing a side where the first n-type contact layer is formed and a side where the multiplication layer is formed to face each other and sticking the substrate and the other substrate together; a fourth step of removing the other substrate after the substrate and the other substrate are stuck together to achieve a state in which the first n-type contact layer, the multiplication layer, the electric field control layer, the absorption layer, and the p-type contact layer are layered in a presented order on the substrate; a fifth step of forming a second n-type contact layer made of an n-type III-V compound semiconductor having a plane-direction lattice constant that matches with the plane-direction lattice constant of InP on the first n-type contact layer around the multiplication layer; a sixth step of forming a p electrode on the p-type contact layer; and a seventh step of forming an n electrode on the second n-type contact layer.

In a configuration example of the method for manufacturing an avalanche photodiode described above, the second step further includes a step of forming on the multiplication layer a buffer layer made of a non-doped III-V compound semiconductor having a plane-direction lattice constant that matches with the plane-direction lattice constant of InP and including an n-type electrically conductive layer in a central portion of the buffer layer in plan view, and in the third step, the first n-type contact layer and the buffer layer are bonded to each other to allow the substrate and the other substrate to be stuck together.

In a configuration example of the method for manufacturing an avalanche photodiode described above, the first step further includes a step of forming on the first n-type contact layer a buffer layer made of the semiconductor to which no dopant has been doped and including an n-type electrically conductive layer in a central portion of the buffer layer, and a step of forming a third n-type contact layer made of the semiconductor having n-type conductivity between the first n-type contact layer and the second n-type contact layer, and in the third step, the buffer layer and the multiplication layer are bonded to each other to allow the substrate and the other substrate to be stuck together.

Effects of Embodiments of the Invention

As described above, embodiments of the present invention, in which the substrate and the first n-type contact layer are made of a semiconductor having thermal conductivity higher than that of InP, allow an increase in the heat dissipation capability of an avalanche photodiode made of a III-V compound semiconductor.

BRIEF DESCRIPTION OF THE DRAWINGS

FIG. 5C is a cross-sectional view showing an element cross section for describing the method for manufacturing the avalanche photodiode according to the second embodiment of the present invention.

FIG. 5D is a cross-sectional view showing an element cross section for describing the method for manufacturing the avalanche photodiode according to the second embodiment of the present invention.

DETAILED DESCRIPTION OF ILLUSTRATIVE EMBODIMENTS

An avalanche photodiode according to each embodiment of the present invention will be described below.

First Embodiment

Figure 1:
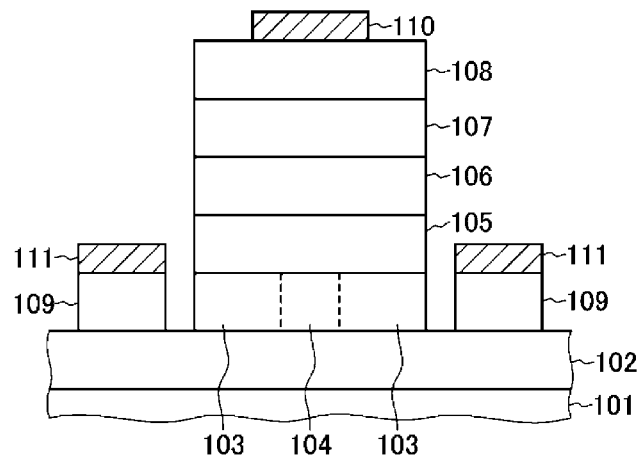
FIG. 1 is a cross-sectional view showing the configuration of an avalanche photodiode according to a first embodiment of the present invention.

An avalanche photodiode according to a first embodiment of the present invention will first be described with reference to FIG. 1.

The avalanche photodiode includes a substrate 101, a first n-type contact layer 102, a multiplication layer 105, an electric field control layer 106, an absorption layer 107, a p-type contact layer 108, and a second n-type contact layer 109. The avalanche photodiode according to the first embodiment further includes a buffer layer 103 and an electrically conductive layer 104. The buffer layer 103, the multiplication layer 105, the electric field control layer 106, the absorption layer 107, and the p-type contact layer 108 are each formed in a predetermined mesa shape.

The substrate 101 is made of a semiconductor having thermal conductivity higher than that of InP. The substrate 101 is made, for example, of SiC. The substrate 101 can instead be made of diamond or AlN. The first n-type contact layer 102 is formed on the substrate 101, made of the same semiconductor as that of the substrate 101, and formed so as to be of n-type. The first n-type contact layer 102 is made, for example, of SiC into which an n-type impurity has been introduced so that the concentration of the n-type impurity is relatively high.

The multiplication layer 105 is formed over the first n-type contact layer 102 and made of a non-doped III-V compound semiconductor having a plane-direction lattice constant that matches with that of InP. The multiplication layer 105 is made, for example, of non-doped InP. The multiplication layer 105 can instead be made of InAlAs.

The buffer layer 103 is formed between the first n-type contact layer 102 and the multiplication layer 105 and made of a non-doped III-V compound semiconductor having a plane-direction lattice constant that matches with that of InP. The buffer layer 103 is made, for example, of InP. The electrically conductive layer 104 is formed in a central portion of the buffer layer 103 in plan view (in plane direction). The center axis of the electrically conductive layer 104 does not need to coincide with the center axis of the buffer layer 103 in plan view, and the electrically conductive layer 104 only needs to be formed so as to be separate from the side surface of the buffer layer 103. The electrically conductive layer 104 can be formed in the central portion of the buffer layer 103 in plan view by selective introduction of an n-type impurity. The buffer layer 103 is formed so as to be in contact both with the first n-type contact layer 102 and the multiplication layer 105. The electrically conductive layer 104 is formed so as to pass through the buffer layer 103 in the thickness direction thereof. The electrically conductive layer 104 is in contact both with the first n-type contact layer 102 and the multiplication layer 105.

The electric field control layer 106 is formed on the multiplication layer 105 and made of a III-V compound semiconductor having a plane-direction lattice constant that matches with that of InP. The electric field control layer 106 is made, for example, of p-type InP to which a p-type impurity has been introduced.

The absorption layer 107 is formed on the electric field control layer 106 and made of a III-V compound semiconductor having a plane-direction lattice constant that matches with that of InP. The absorption layer 107 is made, for example, of InGaAs. The p-type contact layer 108 is formed on the absorption layer 107 and made of a p-type III-V compound semiconductor having a plane-direction lattice constant that matches with that of InP. The p-type contact layer 108 is made, for example, of InGaAsP to which an n-type impurity has been introduced so that the concentration of the n-type impurity is relatively high. The p-type contact layer 108 can instead be made, for example, of InAlGaAs, InP, or InGaAs.

The second n-type contact layer 109 is formed on the first n-type contact layer 102 around the multiplication layer 105 (buffer layer 103) and made of an n-type III-V compound semiconductor having a plane-direction lattice constant that matches with that of InP. In the first embodiment, the second n-type contact layer 109 is formed so as to be in contact with the upper side of the first n-type contact layer 102. The second n-type contact layer 109 is made of the same semiconductor as that of the buffer layer 103. The second n-type contact layer 109 is made, for example, of n-type InP.

In the avalanche photodiode according to the first embodiment, the first n-type contact layer 102 made of the semiconductor that forms the substrate 101 and the buffer layer 103 made of a III-V compound semiconductor, which are disposed so as to be in contact with each other in the layering direction, are formed so as to be bonded to each other. The buffer layer 103 is formed on the first n-type contact layer 102 by using inter-different-material bonding, as will be described later. The buffer layer 103 on the first n-type contact layer 102 is not formed by crystal (epitaxial) growth. The second n-type contact layer 109 is also formed on the first n-type contact layer 102 by using inter-different-material bonding.

A p electrode 110 is formed on the p-type contact layer 108. An n electrode 111 is formed over the first n-type contact layer 102 around the buffer layer 103, which has a mesa shape, via the second n-type contact layer 109. In the first embodiment, the n electrode 111 is formed so as to be in contact with the upper side of the second n-type contact layer 109. A p electrode 309 is made, for example, of an electrode material, such as Pt/Ti/Au, and the n electrode 111 is made of an electrode material, such as Ni/Au.

In the avalanche photodiode according to the first embodiment, heat generated in the multiplication layer 105 is transferred to the substrate 101 via the electrically conductive layer 104 (buffer layer 103) and the first n-type contact layer 102. In related art, it is necessary that an n contact layer is made of InGaAsP (having thermal conductivity of about 1 W/mK) and a substrate is made of InP (having thermal conductivity of about 68 W/mK), and the heat cannot therefore be efficiently dissipated even in a configuration in which a heat sink is connected to the substrate. In the avalanche photodiode according to the first embodiment, in which the first n-type contact layer 102 and the substrate 101 are made of a semiconductor having high thermal conductivity (for example, SiC, which has thermal conductivity of about 370 W/mK), connecting a heat sink to the substrate 101 allows efficient heat dissipation as compared with the related art.

Figure 2:
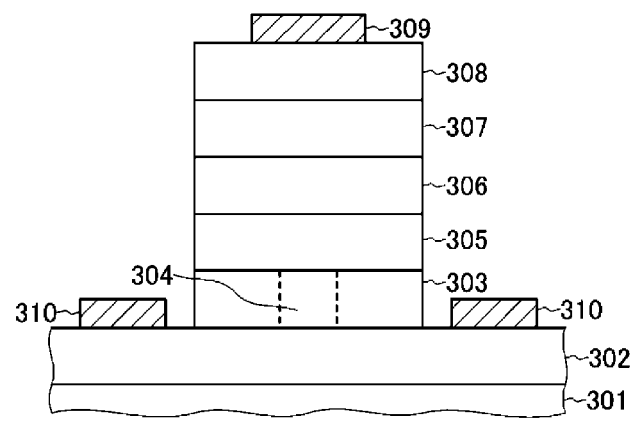
FIG. 2 is a cross-sectional view showing the configuration of an avalanche photodiode.

For example, in an avalanche photodiode shown in FIG. 2, in which the mesa shape has a diameter (element diameter) of 5 µm in plan view, heat resistance estimated in the region from a buffer layer 303 to a substrate 301 is 3500 K/W.

The avalanche photodiode shown in FIG. 2 includes the substrate 301, an n-type contact layer 302, a multiplication layer 305, an electric field control layer 306, an absorption layer 307, a p-type contact layer 308, the buffer layer 303, and an electrically conductive layer 304. The layers described above are the same as the substrate 101, the first n-type contact layer 102, the multiplication layer 105, the electric field control layer 106, the absorption layer 107, the p-type contact layer 108, the buffer layer 103, and the electrically conductive layer 104 in the first embodiment.

A p electrode 309, which is the same as the p electrode 110 in the first embodiment, is formed on the p-type contact layer 308. On the other hand, an n electrode 310 is formed on the n-type contact layer 302 around the buffer layer 303 so as to be in contact with the n-type contact layer 302 in the avalanche photodiode described above, which differs from the avalanche photodiode according to the first embodiment in this regard.

According to the first embodiment, heat resistance estimated in the region from the buffer layer 103 to the substrate 101 is 480 K/W as compared with the avalanche photodiode described above, in which the n electrode 310 is formed on the n-type contact layer 302 so as to be in contact therewith.

The heat resistance described above was calculated by using the method described in Non-Patent Literature 3 on the assumption that the buffer layer 103 (buffer layer 303), the first n-type contact layer 102 (n-type contact layer 302), and the substrate 101 (substrate 301) have thicknesses of 200 nm, 30 nm, and 100 µm, respectively, and that InP, InGaAsP, and SiC have thermal conductivity of 68, 1.0, and 370 W/mK, respectively.

The above description shows that an increase in the temperature estimated in the operation at 20 V and 1 mA in the vicinity of the multiplication layer 305 of the avalanche photodiode shown in FIG. 2 is 69° C., whereas an increase in the temperature in the vicinity of the multiplication layer 305 of the avalanche photodiode according to the first embodiment is suppressed to 9.6° C.

In the avalanche photodiode using no second n-type contact layer and described with reference to FIG. 2, the n electrode 310 is directly formed on the n-type contact layer 302 made of SiC. There has been a report on an electrode structure made, for example, of Al/Ti/Au or Ni/Au in the case of SiC, but a heat treatment performed at 800° C. or higher is required after the metal lamination to form ohmic contact (Non-Patent Literature 4). The avalanche photodiode needs to undergo a heat treatment for electrode formation after each semiconductor layer is layered on the substrate, and a dopant (impurity) contained, for example, in InP diffuses into an adjacent layer at temperatures ranging from about 600 to 700° C. (Non-Patent Literature 5). Therefore, in the high-temperature treatment described above, the doping profile in the electric field control layer cannot be controlled, resulting in a deterioration in the designability of the operating voltage of the avalanche photodiode.

On the other hand, according to the first embodiment, the low-resistance second n-type contact layer 109 is formed on the first n-type contact layer 102, and the n electrode 111 is formed on the thus formed second n-type contact layer 109. Therefore, for example, the electrode can be formed on InP. There has been a report on an electrode structure made of Ti/Pt/Au in the case of InP, and an ohmic electrode can be formed in a heat treatment performed at a temperature ranging from 300 to 450° C. (Non-Patent Literature 6). It is therefore believed that the second n-type contact layer 109 can be used to perform the heat treatment for electrode formation at a lower temperature for suppression of impurity diffusion, whereby the operating voltage of the avalanche photodiode is readily designed.

As described above, since the first n-type contact layer 102 as well as the substrate 101 is made of a semiconductor having thermal conductivity higher than that of InP in the first embodiment, the heat dissipation capability of the avalanche photodiode made of a III-V compound semiconductor can be increased, and the optical input resistance can be improved. In addition, according to the first embodiment, which employs the configuration in which the n electrode 111 is formed on the second n-type contact layer 109, the electrode formation process can be carried out under a lower temperature condition. As a result, according to the first embodiment, the operating voltage of the avalanche photodiode is readily designed.

A method for manufacturing the avalanche photodiode according to the first embodiment of the present invention will next be described with reference to FIGS. 3A to 3D.

Figure 3A:
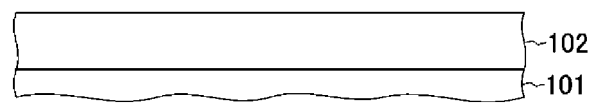
FIG. 3A is a cross-sectional view showing an element cross section for describing a method for manufacturing the avalanche photodiode according to the first embodiment of the present invention.

The first n-type contact layer 102 made of an n-type semiconductor is first formed on the substrate 101, as shown in FIG. 3A (first step). For example, the first n-type contact layer 102 can be formed on the substrate 101 by depositing SiC, for example, by using a known chemical vapor deposition (CVD) method.

Figure 3B:
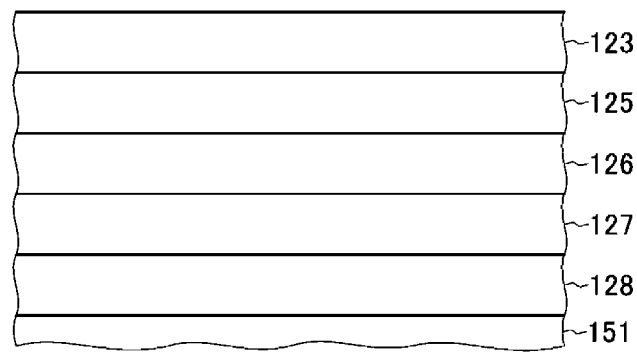
FIG. 3B is a cross-sectional view showing an element cross section for describing the method for manufacturing the avalanche photodiode according to the first embodiment of the present invention.

A first semiconductor layer 128, a second semiconductor layer 127, a third semiconductor layer 126, and a fourth semiconductor layer 125 are formed on another substrate 151 in the presented order, as shown in FIG. 3B (second step). In the first embodiment, a fifth semiconductor layer 123 is formed on the fourth semiconductor layer 125.

The other substrate 151 is made of a III-V compound semiconductor having a plane-direction lattice constant that matches with that of InP. The other substrate 151 is made, for example, of high-resistance InP. The first semiconductor layer 128 is a layer that forms the p-type contact layer 108 and is made of a p-type III-V compound semiconductor having a plane-direction lattice constant that matches with that of InP. The first semiconductor layer 128 is made, for example, of InGaAsP to which an n-type impurity has been introduced so that the concentration of the n-type impurity is relatively high.

The second semiconductor layer 127 is a layer that forms the absorption layer 107 and is made of a III-V compound semiconductor having a plane-direction lattice constant that matches with that of InP. The second semiconductor layer 127 is made, for example, of InGaAs. The third semiconductor layer 126 is a layer that forms the electric field control layer 106 and is made of a III-V compound semiconductor having a plane-direction lattice constant that matches with that of InP. The third semiconductor layer 126 is made, for example, of p-type InP.

The fourth semiconductor layer 125 is a layer that forms the multiplication layer 105 and is made of a non-doped III-V compound semiconductor having a plane-direction lattice constant that matches with that of InP. The fourth semiconductor layer 125 is made, for example, of non-doped InP. The fifth semiconductor layer 123 is a layer that forms the buffer layer 103 and the second n-type contact layer 109 and is made of a non-doped III-V compound semiconductor having a plane-direction lattice constant that matches with that of InP. The fifth semiconductor layer 123 is made, for example, of InP.

The first semiconductor layer 128, the second semiconductor layer 127, the third semiconductor layer 126, the fourth semiconductor layer 125, and the fifth semiconductor layer 123 described above are sequentially formed on the other substrate 151 in the form of epitaxial growth, for example, by using an organic metal vapor deposition method.

Figure 3C:
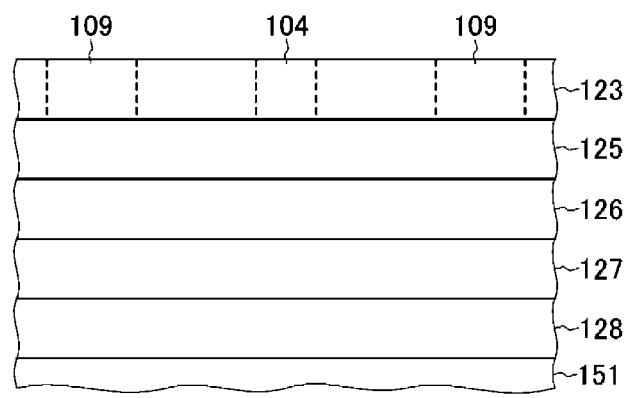
FIG. 3C is a cross-sectional view showing an element cross section for describing the method for manufacturing the avalanche photodiode according to the first embodiment of the present invention.

The electrically conductive layer 104 having n-type conductivity is then formed in a plane-direction central portion of the fifth semiconductor layer 123, as shown in FIG. 3C. In addition, a portion that forms the second n-type contact layer 109 having n-type conductivity is formed in the fifth semiconductor layer 123 around the electrically conductive layer 104. For example, regions that form the electrically conductive layer 104 and the second n-type contact layer 109 are formed by introducing an n-type impurity, such as Si, into regions of the fifth semiconductor layer 123 that form the electrically conductive layer 104 and the second n-type contact layer 109, for example, in selective ion injection.

Figure 3D:
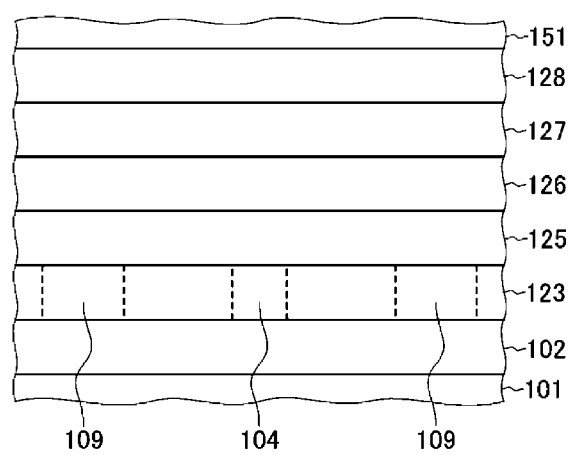
FIG. 3D is a cross-sectional view showing an element cross section for describing the method for manufacturing the avalanche photodiode according to the first embodiment of the present invention.

The side where the first n-type contact layer 102 is formed and the side where the fourth semiconductor layer 125 (multiplication layer 105) is formed are then caused to face each other, and the substrate 101 and the other substrate 151 are stuck together (third step), as shown in FIG. 3D. In the first embodiment, the first n-type contact layer 102 and the fifth semiconductor layer 123 (buffer layer 103) can be bonded to each other to allow the substrate 101 and the other substrate 151 to be stuck together (third step). For example, a surface activation treatment using an Ar beam is performed on the bonding surface of the first n-type contact layer 102 and the bonding surface of the fifth semiconductor layer 123, and the bonding surfaces are bonded to each other (see Non-Patent Literature 7).

The other substrate 151 is then removed to achieve a state in which the first n-type contact layer 102, the fifth semiconductor layer 123, the fourth semiconductor layer 125, the third semiconductor layer 126, the second semiconductor layer 127, and the first semiconductor layer 128 are layered in the presented order on the substrate 101 (fourth step). The other substrate 151 is stripped off, for example, by polishing or etching.

The fifth semiconductor layer 123, the fourth semiconductor layer 125, the third semiconductor layer 126, the second semiconductor layer 127, and the first semiconductor layer 128 are then patterned by using known lithography and etching technologies so as to each have a mesa shape. The buffer layer 103, the multiplication layer 105, the electric field control layer 106, the absorption layer 107, and the p-type contact layer 108 are thus formed on the first n-type contact layer 102. Further, the second n-type contact layer 109 is formed along with the formation of the buffer layer 103 (fifth step). It is assumed that the diameter of the mesa shape in plan view is greater than the diameter of the electrically conductive layer 104. It is further assumed that the diameter of the mesa shape in plan view is sized so that the mesa shape does not overlap with the region where the second n-type contact layer 109 is formed.

The p electrode 110 is formed on the p-type contact layer 108 (sixth step), and the n electrode 111 is formed on the second n-type contact layer 109 (seventh step). For example, a lift-off mask having an opening in the electrode formation region is formed, and a predetermined electrode material is deposited on the lift-off mask, for example, by using an evaporation method, followed by removal (lift-off) of the lift-off mask for formation of the p electrode 110 and the n electrode 111.

The manufacturing method according to the first embodiment described above allows the substrate 101, which is made of SiC or any other semiconductor having thermal conductivity higher than that of InP, the buffer layer 103 (electrically conductive layer 104), the multiplication layer 105, the electric field control layer 106, the absorption layer 107, and the p-type contact layer 108, which are each made of a III-V compound semiconductor and formed on the first n-type contact layer 102 to form an avalanche photodiode. The n electrode 111 is formed over the first n-type contact layer 102 via the second n-type contact layer 109.

Second Embodiment

Figure 4:
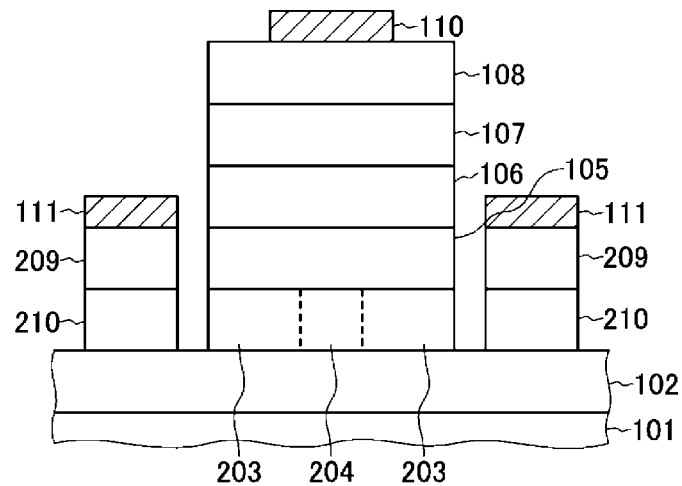
FIG. 4 is a cross-sectional view showing the configuration of an avalanche photodiode according to a second embodiment of the present invention.

An avalanche photodiode according to a second embodiment of the present invention will next be described with reference to FIG. 4.

The avalanche photodiode includes a substrate 101, a first n-type contact layer 102, a multiplication layer 105, an electric field control layer 106, an absorption layer 107, and a p-type contact layer 108. The avalanche photodiode according to the second embodiment further includes a buffer layer 203 and an electrically conductive layer 204. The buffer layer 203, the multiplication layer 105, the electric field control layer 106, the absorption layer 107, and the p-type contact layer 108 are each formed in a predetermined mesa shape.

The substrate 101, the first n-type contact layer 102, the multiplication layer 105, the electric field control layer 106, the absorption layer 107, and the p-type contact layer 108 are the same as those in the first embodiment described above. In the second embodiment, the buffer layer 203 is made of the same semiconductor as that of the substrate 101 (first n-type contact layer 102). The buffer layer 203 is made, for example, of SiC. The electrically conductive layer 204 is an electrically conductive region formed in a central portion of the buffer layer 203 in plan view (in plane direction) by selective introduction of an n-type impurity. The buffer layer 203 is formed so as to be in contact both with the first n-type contact layer 102 and the multiplication layer 105. The electrically conductive layer 204 is formed so as to pass through the buffer layer 203 in the thickness direction thereof. The electrically conductive layer 204 is in contact both with the first n-type contact layer 102 and the multiplication layer 105.

In the avalanche photodiode according to the second embodiment, the buffer layer 203 made of the semiconductor that forms the substrate 101 and the multiplication layer 105 made of a III-V compound semiconductor, which are disposed so as to be in contact with each other in the layering direction, are formed so as to be in contact with each other. The multiplication layer 105 on the buffer layer 203 is not formed by crystal (epitaxial) growth but is formed on the buffer layer 203 by using inter-different-material bonding, as will be described later.

The avalanche photodiode according to the second embodiment further includes a second n-type contact layer 209 formed over the first n-type contact layer 102 around the multiplication layer 105 (buffer layer 203). The second n-type contact layer 209 is made of an n-type III-V compound semiconductor having a plane-direction lattice constant that matches with that of InP. The second n-type contact layer 209 is made, for example, of the same semiconductor as that of the multiplication layer 105. The second n-type contact layer 209 is made, for example, of n-type InP. The second n-type contact layer 209 corresponds to the second n-type contact layer 109 in the avalanche photodiode according to the first embodiment described above.

In addition to the configuration described above, in the second embodiment, a third n-type contact layer 210 formed between the first n-type contact layer 102 and the second n-type contact layer 209 is provided. The third n-type contact layer 210 is formed on the first n-type contact layer 102 around the buffer layer 203. The third n-type contact layer 210 is made of the same semiconductor as that of the buffer layer 203 but having n-type conductivity. In the second embodiment, the third n-type contact layer 210 is first formed so as to be in contact with the upper side of the first n-type contact layer 102. The second n-type contact layer 109 is formed so as to be in contact with the upper side of the third n-type contact layer 210.

The p electrode 110 is formed on the p-type contact layer 108, and the n electrode 111 is formed on the second n-type contact layer 209.

In the avalanche photodiode according to the second embodiment, heat generated in the multiplication layer 105 is transferred to the substrate 101 via the electrically conductive layer 204 (buffer layer 203) and the first n-type contact layer 102. In the avalanche photodiode according to the second embodiment, in which not only the first n-type contact layer 102 and the substrate 101 but the buffer layer 203 are made of a semiconductor having high thermal conductivity, connecting a heat sink to the substrate 101 allows more efficient heat dissipation than in the related art. In the second embodiment, the buffer layer 203 is also made of a semiconductor having high thermal conductivity, whereby the heat dissipation can be more efficiently performed than in the first embodiment.

For example, in the avalanche photodiode according to the second embodiment, in which the mesa shape has a diameter (element diameter) of 5 μm in plan view, heat resistance estimated in the region from the buffer layer 203 to the substrate 101 is 360 K/W. The heat resistance value shows that an increase in the temperature estimated when the avalanche photodiode according to the second embodiment operates at 20 V and 1 mA in the vicinity of the multiplication layer 105 is suppressed to 7.2° C.

In the second embodiment, the low-resistance third n-type contact layer 210 is provided on the first n-type contact layer 102, and the lower-resistance second n-type contact layer 209 is provided on the third n-type contact layer 210, whereby the electrode can be formed, for example, on a III-V compound semiconductor, such as InP. The n electrode 111 of the avalanche photodiode can therefore be ohmic connected at a low heat treatment temperature as in the first embodiment, and it is therefore believed that in a layer into which an impurity has been introduced, diffusion of the impurity is suppressed, whereby the operating voltage of the avalanche photodiode is readily designed.

As described above, since the buffer layer 203 as well as the substrate 101 and the first n-type contact layer 102 is made of a semiconductor having thermal conductivity higher than that of InP in the second embodiment, the heat dissipation capability of the avalanche photodiode made of a III-V compound semiconductor can be increased, whereby the optical input resistance can be improved. Further, providing the third n-type contact layer 210 and the second n-type contact layer 209 on the first n-type contact layer 102 allows the avalanche photodiode to be produced at a lower heat treatment temperature. As a result, the operating voltage of the avalanche photodiode is readily designed.

A band lineup between the multiplication layer 105 made of InP and the electrically conductive layer 204 made of n-type SiC has an offset of about 0.5 eV in the conduction band. However, the potential barrier between the multiplication layer 105 and the electrically conductive layer 204 has a small width, which allows the electrons to pass through a tunnel that is the portion between the multiplication layer 105 and the electrically conductive layer 204, and it is believed that the effect of the offset described above on the sensitivity is ignorable. For example, assuming that the doping concentration in the multiplication layer 105 is $1\times10^{16}$ cm$^{-3}$ and the doping concentration in the electrically conductive layer 204 is $1\times10^{19}$ cm$^{-3}$, the width of the barrier between the multiplication layer 105 and the electrically conductive layer 204 is estimated to be 1 nm or smaller.

A method for manufacturing the avalanche photodiode according to the second embodiment of the present invention will next be described with reference to FIGS. 5A to 5D.

Figure 5A:
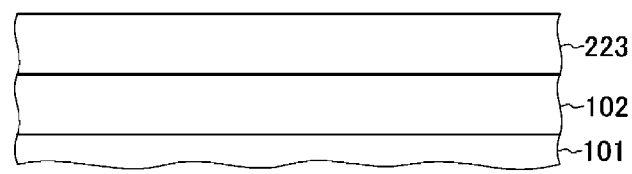
FIG. 5A is a cross-sectional view showing an element cross section for describing a method for manufacturing the avalanche photodiode according to the second embodiment of the present invention.

The first n-type contact layer 102 made of an n-type semiconductor and a fifth semiconductor layer 223 are first formed on the substrate 101 (first step), as shown in FIG. 5A. The fifth semiconductor layer 223 is a layer that forms the buffer layer 203. For example, the first n-type contact layer 102 and the fifth semiconductor layer 223 can be formed on the substrate 101 by depositing SiC, for example, by using a known chemical vapor deposition method.

Figure 5B:
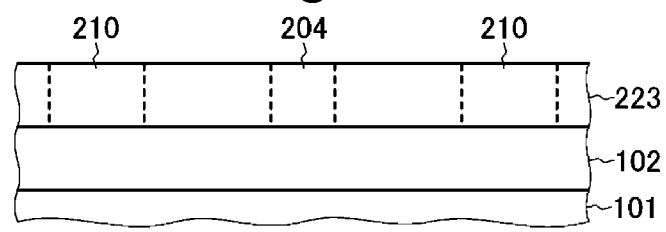
FIG. 5B is a cross-sectional view showing an element cross section for describing the method for manufacturing the avalanche photodiode according to the second embodiment of the present invention.

A region that forms the electrically conductive layer 204 having n-type conductivity is then formed in a plane-direction central portion of the fifth semiconductor layer 223, and a region that forms the third n-type contact layer 210 having n-type conductivity is formed around the region that forms the electrically conductive layer 204, as shown in FIG. 5B. For example, a region that forms the electrically conductive layer 204 and a region that forms the third n-type contact layer 210 are formed by introducing an n-type impurity, such as P, into regions of the fifth semiconductor layer 223 that form the electrically conductive layer 204 and the third n-type contact layer 210, for example, in selective ion injection.

The first semiconductor layer 128, the second semiconductor layer 127, the third semiconductor layer 126, and the fourth semiconductor layer 125 are formed in the presented order on the other substrate 151 (second step), as shown in FIG. 5C. The formation of the first semiconductor layer 128, the second semiconductor layer 127, the third semiconductor layer 126, and the fourth semiconductor layer 125 is the same as the formation thereof in the second embodiment described above. A region that forms the second n-type contact layer 209 is formed in the fourth semiconductor layer 125. For example, a region that forms the second n-type contact layer 209 is formed by introducing an n-type impurity, such as Si, into a region of the fourth semiconductor layer 125 that is the region that forms the second n-type contact layer 209, for example, in selective ion injection. In the bonding of the fifth semiconductor layer 223 and the fourth semiconductor layer 125 to each other, which will be described later, the second n-type contact layer 209 is aligned so that the third n-type contact layer 210 and the second n-type contact layer 209 coincide with each other in the same position in the plane direction.

The side where the first n-type contact layer 102 is formed and the side where the fourth semiconductor layer 125 (multiplication layer 105) is formed are then caused to face each other, and the substrate 101 and the other substrate 151 are stuck together (third step), as shown in FIG. 5D. In the second embodiment, the fifth semiconductor layer 223 (buffer layer 203) and the fourth semiconductor layer 125 are bonded to each other to allow the substrate 101 and the other substrate 151 to be stuck together (third step). For example, a surface activation treatment using an Ar beam is performed on the bonding surface of the fifth semiconductor layer 223 and the bonding surface of the fourth semiconductor layer 125, and the bonding surfaces are bonded to each other (see Non-Patent Literature 4).

In the second embodiment, the third n-type contact layer 210 formed by using the fifth semiconductor layer 223, which forms the buffer layer 203, is provided between the first n-type contact layer 102 and the second n-type contact layer 209. As a result, the fourth semiconductor layer 125, which forms the multiplication layer 105, and the fifth semiconductor layer 223, which forms the buffer layer 203, can be bonded to each other with the bonding surfaces thereof being flat.

The other substrate 151 is then removed to achieve a state in which the first n-type contact layer 102, the fifth semiconductor layer 223, the fourth semiconductor layer 125, the third semiconductor layer 126, the second semiconductor layer 127, and the first semiconductor layer 128 are layered on each other in the presented order on the substrate 101 (fourth step). The other substrate 151 is stripped off, for example, by polishing or etching.

The fifth semiconductor layer 223, the fourth semiconductor layer 125, the third semiconductor layer 126, the second semiconductor layer 127, and the first semiconductor layer 128 are then patterned by using known lithography and etching technologies so as to each have a mesa shape. The buffer layer 203, the multiplication layer 105, the electric field control layer 106, the absorption layer 107, and the p-type contact layer 108 are thus formed on the first n-type contact layer 102. Further, the third n-type contact layer 210 is formed along with the formation of the buffer layer 203. The second n-type contact layer 109 is formed along with the formation of the multiplication layer 105 (fifth step). It is assumed that the diameter of the mesa shape in plan view is greater than the diameter of the electrically conductive layer 204. It is further assumed that the diameter of the mesa shape in plan view is sized so that the mesa shape does not overlap with the region where the second n-type contact layer 209 and the third n-type contact layer 210 are formed.

The p electrode 110 is formed on the p-type contact layer 108 (sixth step), and the n electrode 111 is formed on the second n-type contact layer 209 (seventh step), as in the first embodiment.

The manufacturing method according to the second embodiment described above allows the substrate 101, which is made of SiC or any other semiconductor having thermal conductivity higher than that of InP, the first n-type contact layer 102, the multiplication layer 105, the electric field control layer 106, the absorption layer 107, and the p-type contact layer 108, which are each made of a III-V compound semiconductor and formed on the buffer layer 203 (electrically conductive layer 204), to form an avalanche photodiode.

As described above, according to embodiments of the present invention, the substrate and the first n-type contact layer are made of a semiconductor having thermal conductivity higher than that of InP, whereby the heat dissipation capability of the avalanche photodiode made of a III-V compound semiconductor can be increased. Since the second n-type contact layer is provided on the first n-type contact layer, the heat treatment for electrode formation can be performed at a lower temperature, whereby the operating voltage of the avalanche photodiode is more readily designed.

Use of a material having a bandgap smaller than the energy of light incident on an n-type contact layer disposed in the optical path causes absorption of the light in the n-type contact layer and recombination of the excited holes in the n-type contact layer, leading to a decrease in the light reception sensitivity. The n-type contact layer is therefore in general made, for example, of InGaAsP, which has a large bandgap. It is, however, difficult to perform composition control in epitaxial growth of InGaAsP, which is a quaternary semiconductor, resulting in problems of yield and manufacturing cost of the avalanche photodiode. In contrast, embodiments of the present invention, in which the n-type contact layer disposed in the optical path is made, for example, of SiC, which has a large bandgap, can solve the manufacturing problems described above.

The present invention is not limited to the embodiments described above, and it is obvious that a person skilled in the art can implement many variations and combinations within the scope of the technical idea of the present invention.

REFERENCE SIGNS LIST

101 Substrate
102 First n-type contact layer
103 Buffer layer
104 Electrically conductive layer
105 Multiplication layer
106 Electric field control layer
107 Absorption layer
108 p-type contact layer
109 Second n-type contact layer
110 p electrode
111 n electrode

The invention claimed is:

1. An avalanche photodiode comprising:
a substrate comprising a semiconductor having a thermal conductivity higher than a thermal conductivity of InP;
a first n-type contact layer on the substrate and comprising the semiconductor having an n-type conductivity;
a multiplication layer on the first n-type contact layer and comprising a first non-doped III-V compound semiconductor having a plane-direction lattice constant that matches with a plane-direction lattice constant of InP;
an electric field control layer on the multiplication layer and comprising a first III-V compound semiconductor having a plane-direction lattice constant that matches with the plane-direction lattice constant of InP;
an absorption layer on the electric field control layer and comprising a second III-V compound semiconductor having a plane-direction lattice constant that matches with the plane-direction lattice constant of InP;
a p-type contact layer on the absorption layer and comprising a p-type III-V compound semiconductor having a plane-direction lattice constant that matches with the plane-direction lattice constant of InP;
a buffer layer between the first n-type contact layer and the multiplication layer and comprising a second non-doped III-V compound semiconductor having a plane-direction lattice constant that matches with the plane-direction lattice constant of InP;
an n-type electrically conductive layer in a central portion of the buffer layer in plan view;
a second n-type contact layer on the first n-type contact layer around the multiplication layer and comprising an n-type III-V compound semiconductor having a plane-direction lattice constant that matches with the plane-direction lattice constant of InP;
a p electrode on the p-type contact layer; and
an n electrode on the second n-type contact layer.

2. The avalanche photodiode according to claim 1, wherein the buffer layer comprises a third non-doped III-V compound semiconductor having a plane-direction lattice constant that matches with the plane-direction lattice constant of InP.

3. The avalanche photodiode according to claim 2, wherein the first n-type contact layer and a layer on the first n-type contact layer comprising a third III-V compound semiconductor are bonded to each other.

4. The avalanche photodiode according to claim 1, wherein:
the buffer layer comprises the semiconductor to which no dopant has been doped; and
the avalanche photodiode further comprises a third n-type contact layer between the first n-type contact layer and the second n-type contact layer and comprising the semiconductor having the n-type conductivity.

5. The avalanche photodiode according to claim 4, wherein the buffer layer and the n-type electrically conductive layer are bonded to the first n-type contact layer.

6. A method for manufacturing an avalanche photodiode, the method comprising:
forming a first n-type contact layer on a substrate comprising a semiconductor having a thermal conductivity higher than a thermal conductivity of InP, the first n-type contact layer comprising the semiconductor having an n-type conductivity;
forming a p-type contact layer made of a p-type III-V compound semiconductor having a plane-direction lattice constant that matches with a plane-direction lattice constant of InP on a second substrate made of a first III-V compound semiconductor having a plane-direction lattice constant that matches with the plane-direction lattice constant of InP;
forming an absorption layer comprising a second III-V compound semiconductor having a plane-direction lattice constant that matches with the plane-direction lattice constant of InP on the p-type contact layer;
forming an electric field control layer comprising a third III-V compound semiconductor having a plane-direction lattice constant that matches with the plane-direction lattice constant of InP on the absorption layer; and
forming a multiplication layer comprising a non-doped III-V compound semiconductor having a plane-direction lattice constant that matches with the plane-direction lattice constant of InP on the electric field control layer;
causing a side where the first n-type contact layer is formed and a side where the multiplication layer is formed to face each other and sticking the substrate and the second substrate together;
removing the second substrate after the substrate and the second substrate are stuck together to achieve a state in which the first n-type contact layer, the multiplication layer, the electric field control layer, the absorption layer, and the p-type contact layer are layered in a presented order on the substrate;
forming a second n-type contact layer comprising an n-type III-V compound semiconductor having a plane-direction lattice constant that matches with the plane-direction lattice constant of InP on the first n-type contact layer around the multiplication layer;
forming a p electrode on the p-type contact layer; and
forming an n electrode on the second n-type contact layer.

7. The method according to claim 6, further comprising forming a buffer layer comprising a second non-doped III-V compound semiconductor having a plane-direction lattice constant that matches with the plane-direction lattice constant of InP on the multiplication layer and including an n-type electrically conductive layer in a central portion of the buffer layer in plan view.

8. The method according to claim 7, wherein the first n-type contact layer and the buffer layer are bonded to each other to allow the substrate and the second substrate to be stuck together.

9. The method according to claim 6, further comprising:
   forming a buffer layer made of the semiconductor to which no dopant has been doped on the first n-type contact layer and including an n-type electrically conductive layer in a central portion of the buffer layer; and
   forming a third n-type contact layer made of the semiconductor having the n-type conductivity between the first n-type contact layer and the second n-type contact layer.

10. The method according to claim 9, wherein the buffer layer and the multiplication layer are bonded to each other to allow the substrate and the second substrate to be stuck together.

\* \* \* \* \*